(12) United States Patent
Tseng

(10) Patent No.: US 6,956,626 B2
(45) Date of Patent: Oct. 18, 2005

(54) THIN FILM TRANSISTOR LIQUID CRYSTAL DISPLAY STRUCTURE

(75) Inventor: Shiuh-Ping Tseng, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 30 days.

(21) Appl. No.: 10/338,421

(22) Filed: Jan. 7, 2003

(65) Prior Publication Data
US 2003/0136991 A1 Jul. 24, 2003

Related U.S. Application Data

(62) Division of application No. 09/976,771, filed on Oct. 12, 2001, now Pat. No. 6,537,840.

(30) Foreign Application Priority Data
Oct. 12, 2000 (TW) .................................. 89121295 A

(51) Int. Cl.⁷ ..................... G02F 1/1333; G02F 1/1343; G02F 1/136
(52) U.S. Cl. ............................... 349/40; 349/38; 349/43
(58) Field of Search .............................. 349/38, 39, 43, 349/40; 257/57, 59, 347–353, 291, 60; 438/309–311, 30, 149, 479, 517, 152–156, 48, 158, 162

(56) References Cited

U.S. PATENT DOCUMENTS

| | | | | |
|---|---|---|---|---|
| 5,478,766 A | * | 12/1995 | Park et al. | ..................... 437/40 |
| 6,078,365 A | * | 6/2000 | Ueda et al. | ................... 349/43 |
| 6,255,130 B1 | | 7/2001 | Kim | ............................. 438/30 |
| 6,387,737 B1 | * | 5/2002 | Yamazaki et al. | .......... 438/149 |

* cited by examiner

Primary Examiner—Erik Kielin
(74) Attorney, Agent, or Firm—Ladas & Parry LLP

(57) ABSTRACT

A process for manufacturing a thin film transistor liquid crystal display (TFT-LCD) is disclosed. The process can reduce the number of the mask used in the photolithography process to three masks, form a capacitor during the manufacturing process simultaneously, and enhance the transmission rate of the TFT-LCD. Because the pixel electrodes are formed directly on the substrate, without forming an insulator layer in the pixel area, the transmission can be enhanced. The manufacturing process also provides a protective circuit for avoiding electrostatic discharge damage, and a passivation layer to protect the capacitor, the gate line, and the signal line.

10 Claims, 9 Drawing Sheets

THIN FILM TRANSISTOR LIQUID CRYSTAL DISPLAY STRUCTURE

This is a divisional of U.S. Ser. No. 09/976,771 filed on Oct. 12, 2001 now U.S. Pat. No. 6,537,840.

BACKGROUND OF THE INVENTION

1. Field of the Invention

The present invention relates in general to a manufacturing process of a thin film transistor liquid crystal display (TFT-LCD). In particular, the present invention relates to a TFT-LCD manufacturing process using three photolithography process masks.

2. Description of the Related Art

A liquid crystal display (LCD) employing a thin film transistor (TFT) as an active device provides advantages of low power consumption, thin profile, light weight and low driving voltage. However, the TFT process consists of multiple masks in multiple photolithography processes, usually more than seven masks, thereby encountering the problems of poor yield and high cost. In order to improve the problems, reducing the steps of the photolithography process becomes an important issue.

U.S. Pat. No. 5,478,766 discloses a process for forming of a TFT-LCD by multiple photolithography processes using three masks. FIGS. 1A to 1C show top views of the masks used in the TFT-LCD manufacturing process according to the prior art, and FIGS. 2A to 2E are cross-sectional views along the line A–A' in FIGS. 1A to 1C of the prior art. First, as shown in FIG. 1A and FIG. 2A, a first metal layer is deposited on a substrate 21, and patterned by a first photolithography process to form a gate electrode 22 and a gate line (not shown) connected to the gate electrode 22. Usually, the metal layer is further oxidized to form a protecting layer 23 covering the gate electrode 22. Then, as shown in FIG. 2B, an insulating layer 24, an amorphous silicon layer 25 and a doped silicon layer 26 are deposited on the substrate 21. Next, as shown in FIGS. 1B and 2C, a second metal layer is deposited on the doped silicon layer 26. The second metal layer is then patterned as a signal line 27 and a source/drain metal layer 28 by a second photolithography process. AS shown in FIGS. 1C and 2D, an indium tin oxide (ITO) layer is deposited on the substrate 21. A photo resist layer (not shown) is then formed above the ITO layer, then the ITO layer is patterned to form a pixel electrode 29 by a third photolithography process. Finally, as shown in FIG. 2E, the same photo resist layer is used to define the patterns of the source/drain metal layer 28 and the doped silicon layer 26. A source electrode 31 and a drain electrode 32 are finally formed.

According to the above process, the masks used in the photolithography process are reduced to three masks; however, an insulating layer 24 is formed between the pixel electrode 29 and the substrate 21, and the transmission of the display is decreased. Further, the first metal layer and the second metal layer cannot electrically connect for avoiding the damage of electrostatic discharge (ESD) because the insulating layer 24 is remained on the substrate 21. The reliability of the LCD may be poor because of the damage of electrostatic discharge (ESD).

SUMMARY OF THE INVENTION

An object of the present invention is to provide a process for manufacturing a thin film transistor liquid crystal display (TFT-LCD) by three masks, providing a protective circuit to avoid ESD effect, increasing the transmission of the TFT-LCD, and forming a capacitor in the TFT-LCD to solve the above problems.

Another object of the present invention is to provide a process for manufacturing a thin film transistor liquid crystal display (TFT-LCD) with a protective structure to avoid capacitor shorts and shorts between the gate line and the signal line.

In achieving the above objects, the process for manufacturing the thin film transistor liquid crystal display comprises the steps of:

(a) providing a substrate having a transistor area, a capacitor area, a pixel area, and a gate pad area;

(b) depositing and patterning a first metal layer on the substrate to form a gate electrode, a capacitor upper electrode, and a pad electrode respectively in the transistor area, the capacitor area, and the gate pad area;

(c) depositing and patterning an insulating layer, a semiconductor layer, a doped silicon layer and a second metal layer to (1) form an TFT island structure in the transistor area and a capacitor in the capacitor area, and (2) remove the second metal layer, the doped silicon layer, the semiconductor layer and the insulating layer in the pixel area and the gate pad area to expose the substrate in the pixel area and expose the pad electrode in the gate pad area; and (d) depositing a transparent conducting layer, and (1) patterning the transparent conducting layer by defining a channel area in the transistor area, and removing the transparent conducting layer within the channel area, and (2) removing parts of the second metal layer and the doped silicon layer uncovered by the transparent conducting layer so as to define a source electrode and a drain electrode in the transistor area, therefore, the source electrode and the drain electrode being separated by the channel area to expose the semiconductor layer in the channel area.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1A:
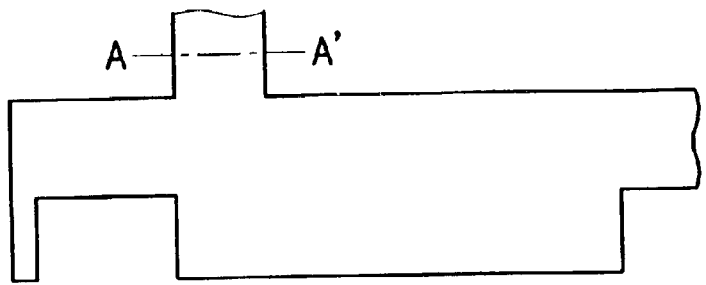
FIGS. 1A to 1C are top views showing the steps of the TFT-LCD manufacturing process according to the prior art.
Figure 1B:
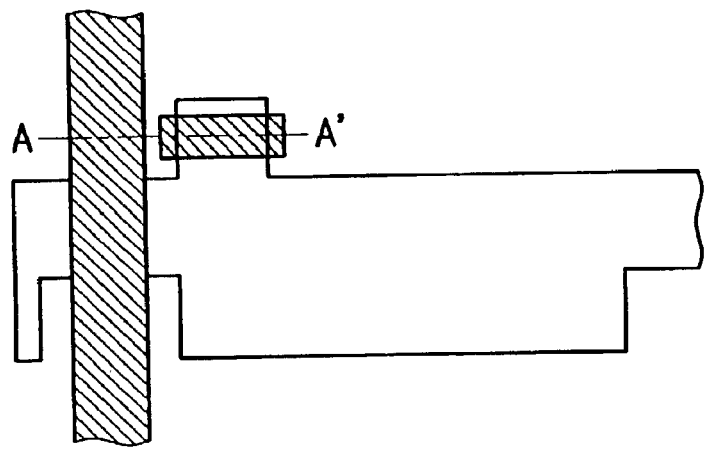
Figure 1C:
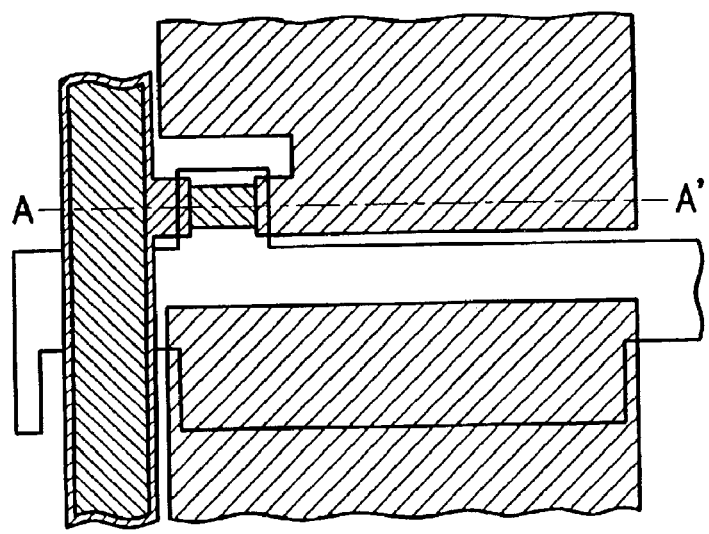
Figure 2A:
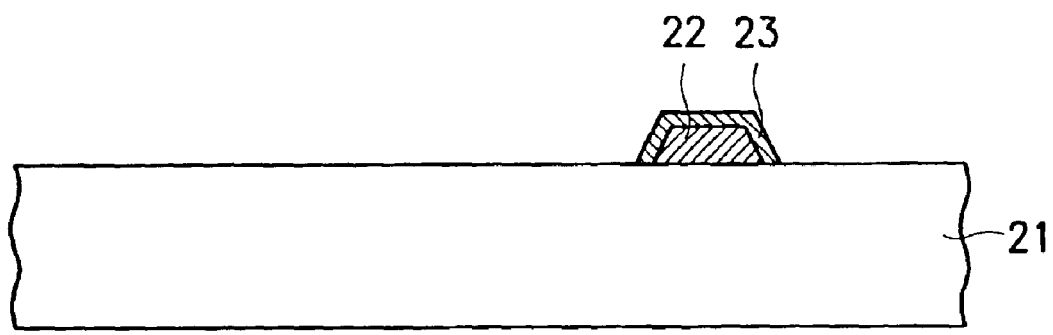
FIGS. 2A to 2E are cross-sectional views along the line A–A' in FIG. 1A to FIG. 1C according to the prior art.
Figure 2B:
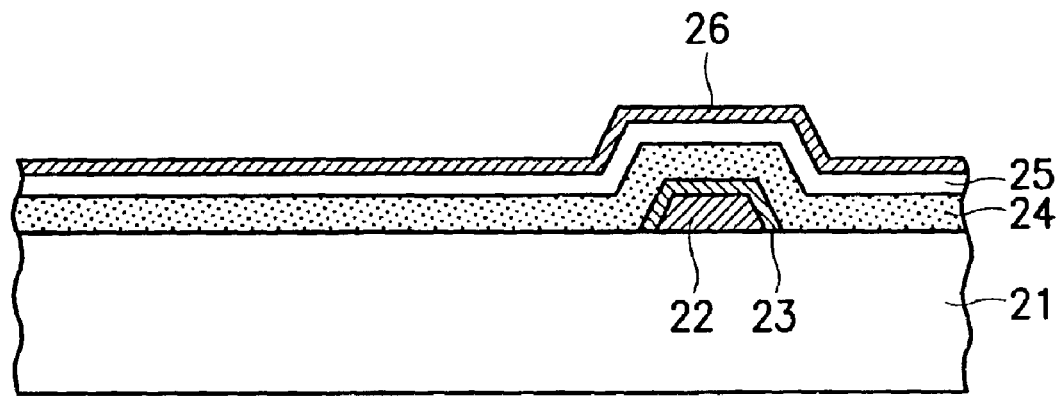
Figure 2C:
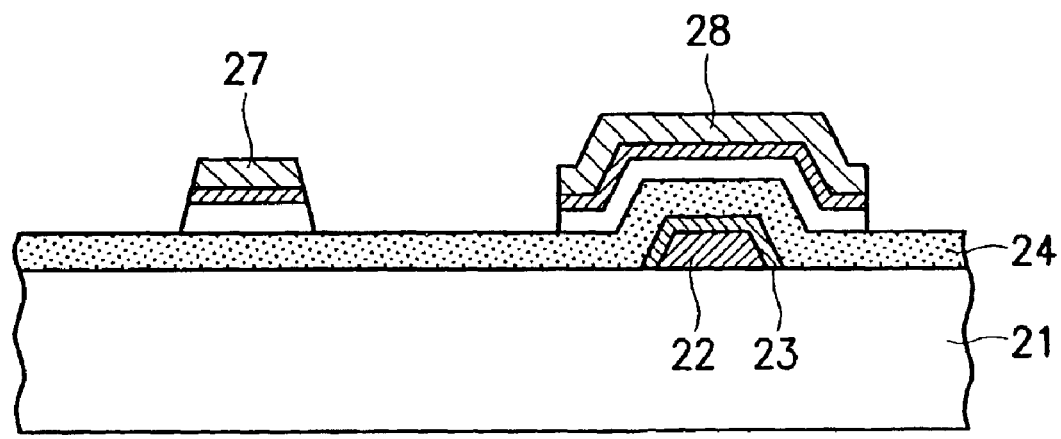
Figure 2D:
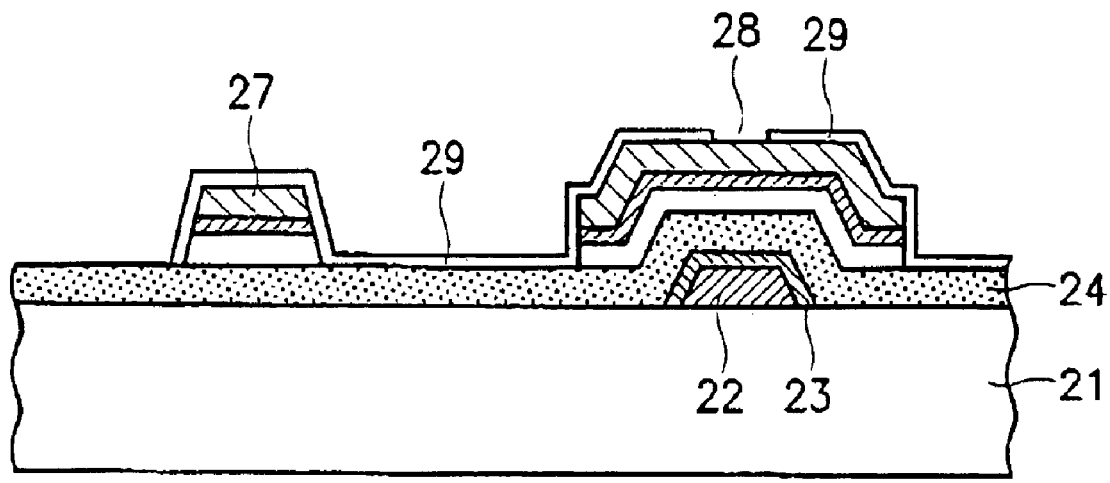
Figure 2E:
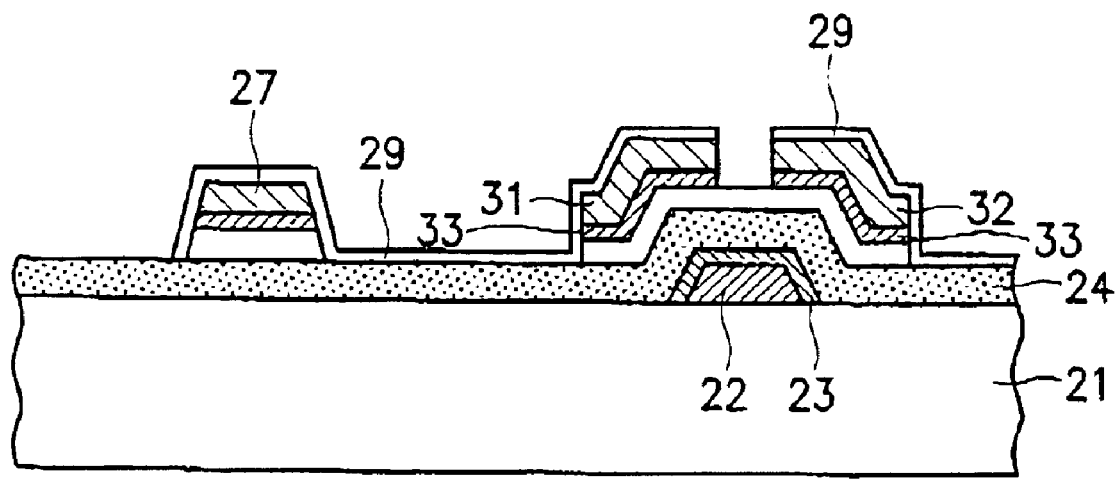
Figure 3A:
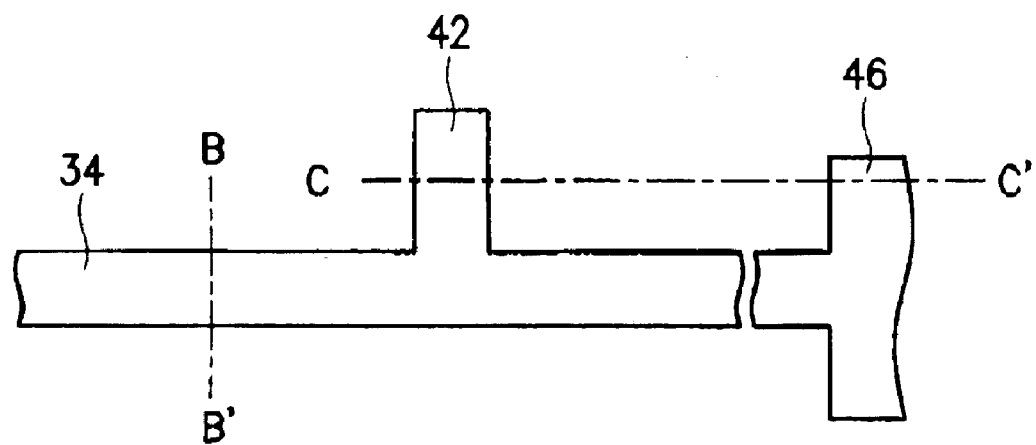
FIGS. 3A to 3C are top views of the first embodiment of a TFT-LCD according to the present invention.
Figure 3B:
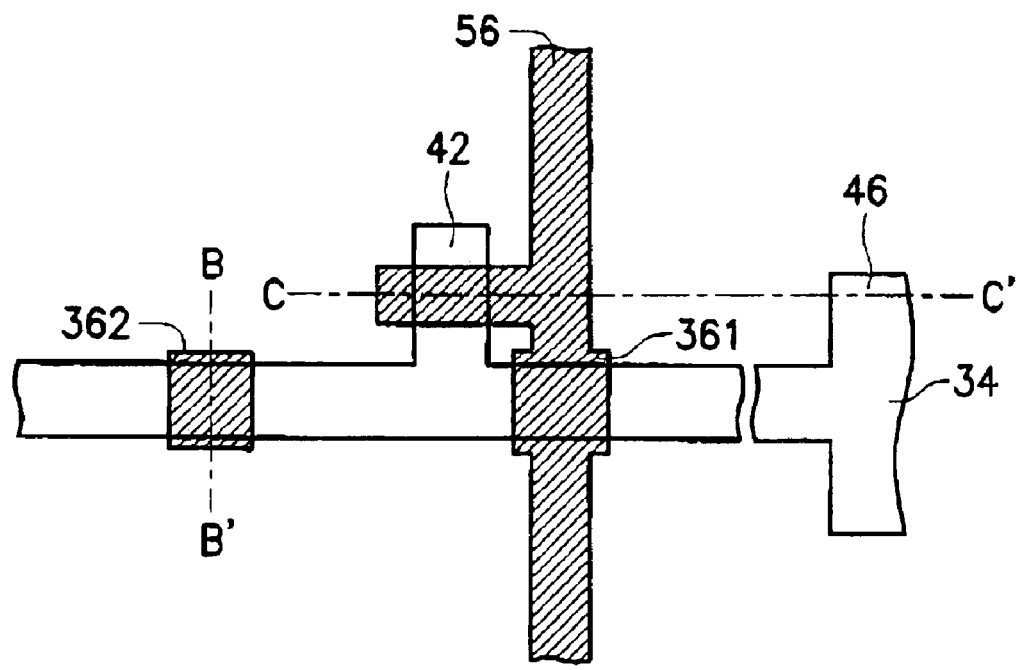
Figure 3C:
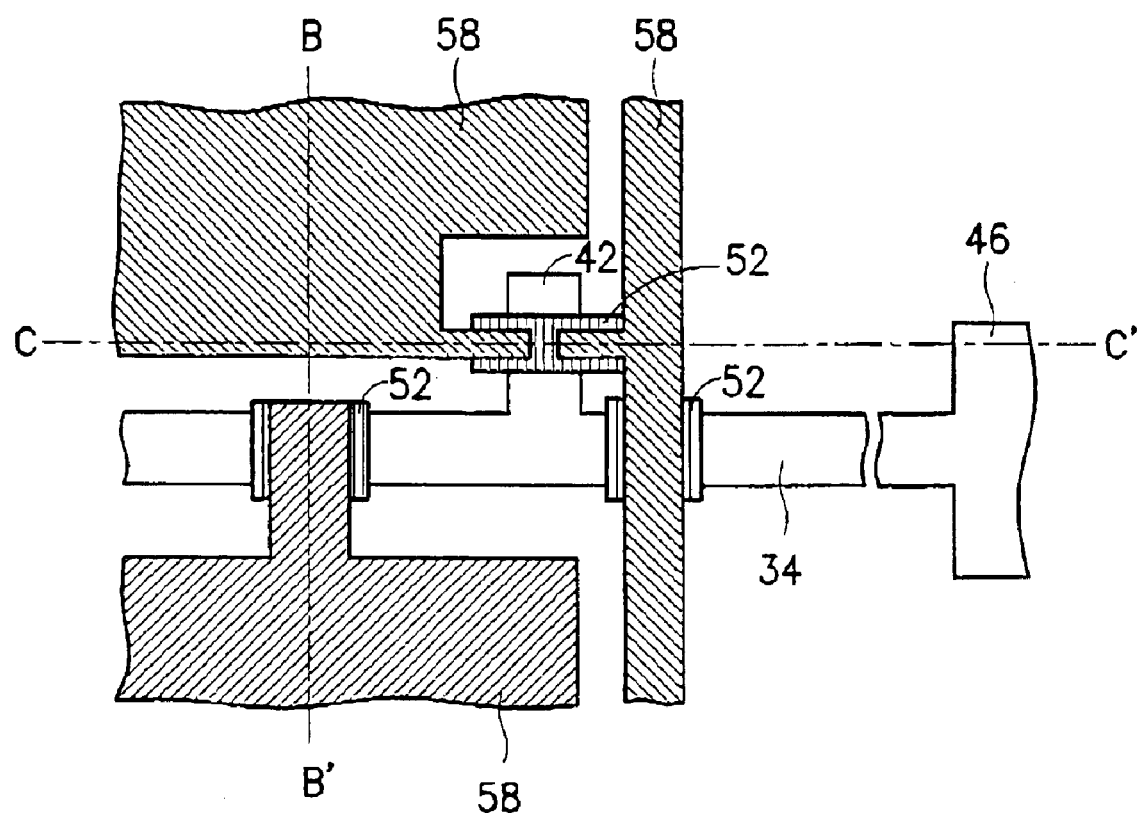

Please refer to FIGS. 3A to 3C and FIGS. 4A to 4D. FIGS. 3A to 3C show top views of the first embodiment in the present invention. FIG. 3A, FIG. 3B, and FIG. 3C respectively show the TFT-LCD in the first, second, and third photolithography processes, and FIGS. 4A to 4D are cross-sectional views of FIGS. 3A to 3C along lines B–B' and C–C'.

Figure 4A:
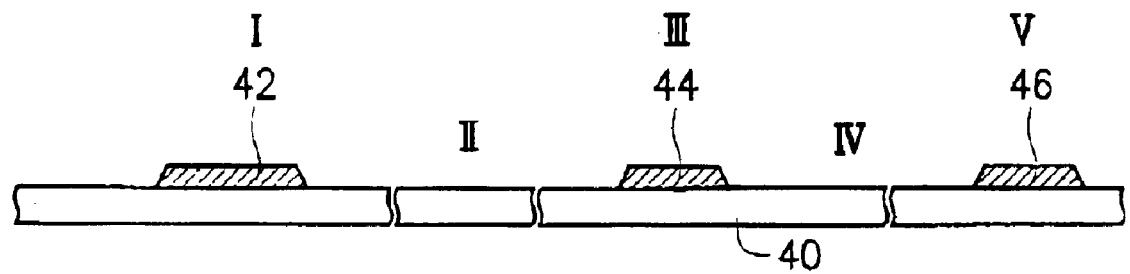
FIGS. 4A to 4D are cross-sectional views of FIG. 3A to FIG. 3C along the lines B–B' and C–C'.

First, a substrate 40 is provided. The substrate 40 has a transistor area (area I), a signal line area (area II), a capacitor area (area III), a pixel area (area IV), and a gate pad area (area V). Then, as shown in FIG. 3A and FIG. 4A, a first metal layer is deposited on the substrate 40, and the first metal layer is patterned to form a gate line 34 including a gate electrode 42, a capacitor bottom electrode 44, and a pad electrode 46.

Figure 4B:
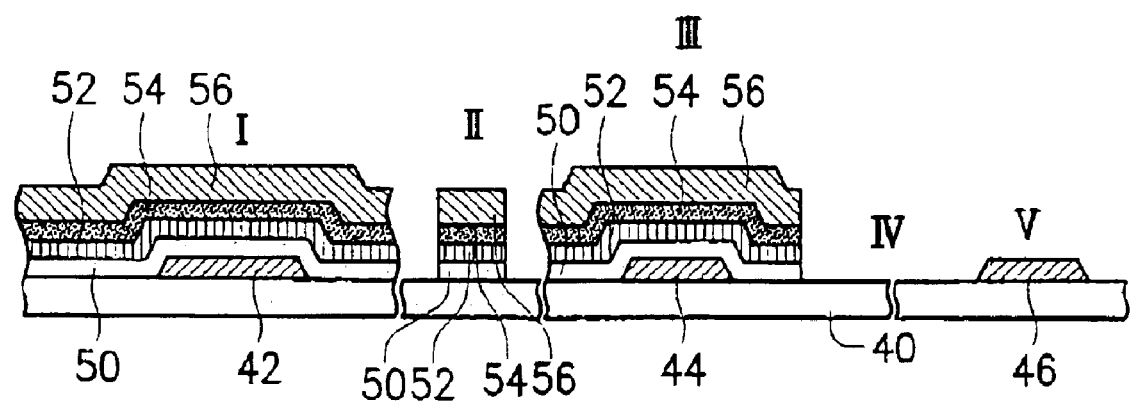

As shown in FIG. 3B and FIG. 4B, an insulating layer 50, a semiconductor layer 52, a doped silicon layer 54 and a second metal layer 56 are deposited on substrate 40, respectively. The second photolithography process is used to pattern the second metal layer 56, the doped silicon layer 54, the semiconductor layer 52, and the insulating layer 50 so as to define a TFT island structure and a capacitor on the transistor area I and the capacitor are III, respectively. At the same time, the second metal layer 56, the doped silicon layer 54, the semiconductor layer 52, and the insulating layer 50 are removed from the pixel area IV and the gate pad area V, therefore, the substrate 40 is exposed in the pixel area IV and the pad electrode 46 is exposed in the gate pad area V. In the signal line area II, a signal line 56 is formed, and part of the signal line 56 overlaps the gate line 34 as shown in FIG. 3B.

Figure 4C:
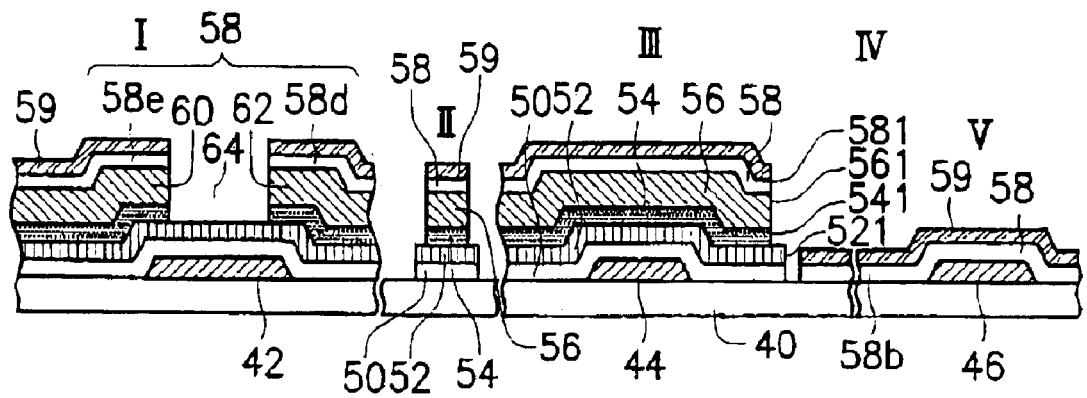

As shown in FIG. 3C and FIG. 4C, a transparent conducting layer 58 is deposited on the substrate 40. A patterned photo resist layer 59 is formed on the transparent conducting layer 58 as a mask. By using the mask, a third photolithography process is performed to pattern the transparent conducting layer 58. In this step, a channel area 64 is first defined in the transistor area I. A part of the transparent conducting layer 58 is then removed from the channel area 64, and the pixel electrodes 58e, 58d, 58b are respectively formed above the TFT island structure and in the pixel area IV. The same photo resist layer 59 is used to pattern the second metal layer and the doped silicon layer by another etching process. In this step, parts of the second metal layer 56 and the doped silicon layer 54 uncovered by the photo resist layer 59 are removed, and a source electrode 60 and a drain electrode 62 are defined in the transistor area I. The source electrode 60 and the drain electrode 62 are separated by the channel area 64, and the semiconductor layer 52 is exposed in the channel area 64. In this etching process, a time control method is used to control the condition of etching, and therefore, an etching end point of the etching process is defined when the doped silicon layer 54 is completely removed in the channel area 64. In other words, the etching condition of the whole process can be controlled by the etching time of the doped silicon layer 54. Finally, photo resist layer 59 is removed and the manufacturing process is finished.

Figure 4D:
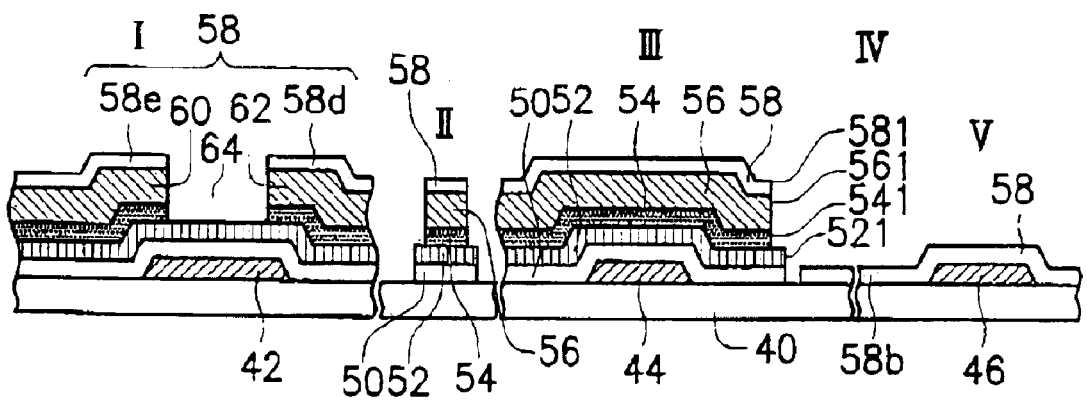

In order to avoid circuit shorts in the capacitor or between the gate line and signal line, parts of the signal line are wider at the positions 361, 362 where the signal line 56 overlays the gate line 34. Further, the photo resist layer 59 used to pattern the transparent conducting layer 58 is also used to pattern the second metal layer 56 and the doped silicon layer 54 as shown in FIG. 4C. Thus, all of the transparent conducting layer 58, the second metal layer 56, and the doped silicon layer 54 have the same pattern. For example, in the capacitor area III, a sidewall 581 of the transparent conducting layer 58 is aligned to a sidewall 561 of the second metal layer 56 and a sidewall 541 of the doped silicon layer 54, but the sidewall 581 of the transparent conducting layer 58 is not aligned to a sidewall 521 of the semiconductor layer 52. Besides, in the signal line area II, the transparent conducting layer 58 is narrower than the semiconductor layer 52 and the insulating layer 50 as shown in FIG. 4D. Therefore, if a particle (not shown) falls in the capacitor area III, the second metal layer 56 will not be electrically connected to the first metal layer 44 by the particle because the second metal layer 56 and the first metal layer 44 have different widths. The probability of the short circuit caused by dropped particles contacting the second metal layer and first metal layer at the same time is reduced.

According to the above description, the advantages of the manufacturing process in the invention include: (1) the number of the mask used in the photolithography process is reduced to three masks, (2) a capacitor can be formed in the manufacturing process simultaneously, and (3) the manufacturing steps of the process is reduced, so the manufacturing throughput is increased. Further, as shown in FIG. 4D, the pixel electrode 58b in the pixel area V is formed on the substrate 40 directly. No insulating layer is formed between the pixel electrode 58b and the substrate 40 so the transmission of the TFT-LCD can be greatly enhanced.

Figure 5A:
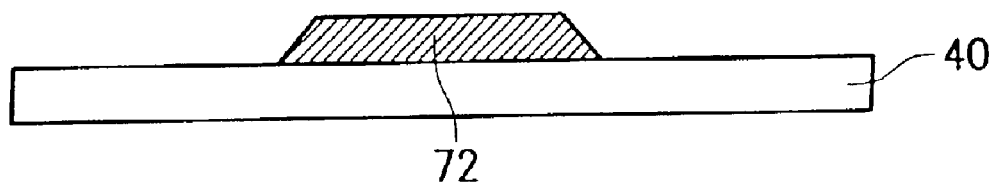
FIGS. 5A to 5C are cross-sectional views showing the structure of the electrostatic discharge (ESD) protective circuit.
Figure 5B:
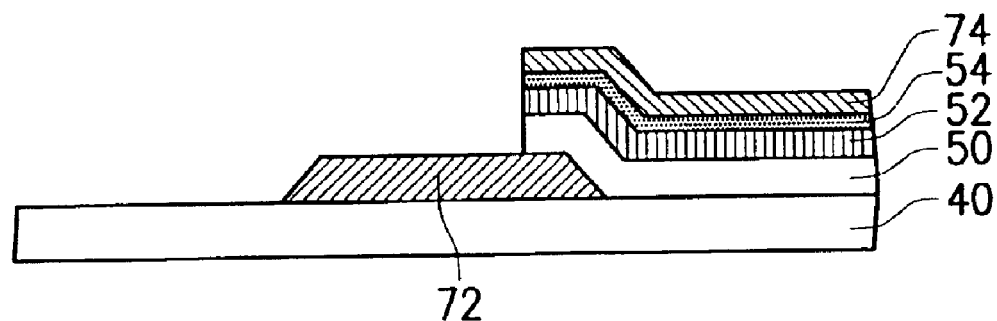
Figure 5C:
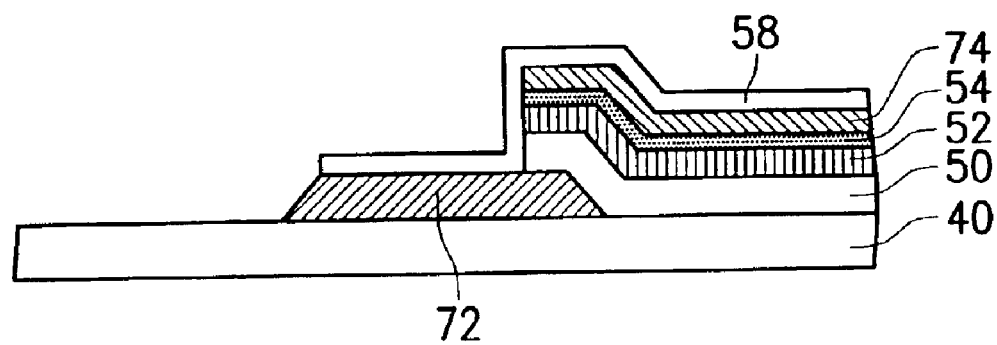

In addition, an electrostatic discharge (ESD) protective circuit is also formed around the LCD panel. Please refer to FIG. 5A to FIG. 5C which are cross sectional views showing the process for forming the ESD protective circuit. First, as shown in FIG. 5A, a gate line 72 is formed around the LCD display and is electrically connected to the gate line 34 and the gate electrode 42. A signal line 74 is further formed as shown in FIG. 5B. The insulating layer 50, the semiconductor layer 52, and the doped silicon layer 54 are formed between the gate line 72 and the signal line 74, respectively. Finally, a transparent conducting layer 58 is formed as shown in FIG. 5C. The insulating layer 50, the semiconductor layer 52, and the doped silicon layer 54 just cover a part of the gate line 72 so the transparent conducting layer 58 can be formed above the signal line 74 and the gate line 72 at the same time. The gate line 72 (the first metal layer) and the signal line 74 (the second metal layer) can thus be electrically connected by the transparent conducting layer 58 so as to form the protective circuit for ESD protection. Thus, it is unnecessary to form a through hole by remove a part of the insulating layer above the gate line just for allowing the transparent conducting layer to be electrically connected with the gate line and the signal line.

Figure 6:
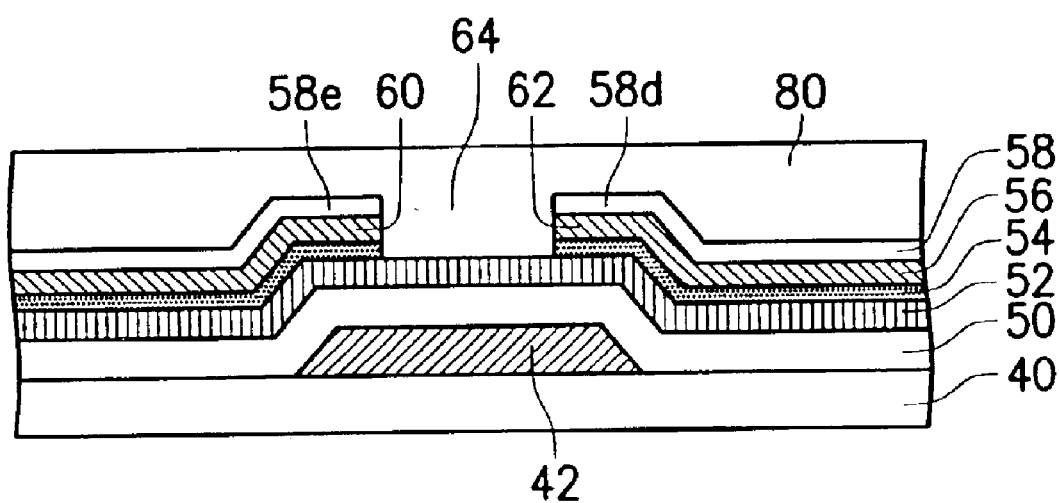
FIG. 6 is a cross-sectional view of the second embodiment in the present invention.

Please refer to FIG. 6 which shows a transistor structure of the second embodiment in the present invention. A passivation layer 80 is formed by a fourth photolithography process as shown in FIG. 6. The passivation layer 80 is a planar layer and covers the pixel electrodes 58d, 58e, the source electrode 60, the drain electrode 62 and the channel area 64. Therefore, the passivation layer 80 can protect the channel area 64, the reliability of channel area 64 is enhanced, and the whole TFT-LCD surface can be planarized by the passivation layer 80.

In the above-mention process, the insulating layer 50 can be made by silicon nitride and the substrate 40 is made by silicon oxide, so the etching reactants in the second photolithography process has a high selective ratio for nitride and oxide in order to remove the insulating layer completely. In addition, the semiconductor layer 52 is an amorphous silicon layer, the doped silicon layer 54 is a n type amorphous silicon layer, and the transparent conducting layer 58 is made by indium Tin Oxide (ITO) layer.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A thin film transistor liquid crystal display, comprising:
   a substrate;
   a thin film transistor comprising:
   a gate electrode formed on the substrate;
   a transistor insulating layer and a transistor semiconductor layer formed on the gate electrode;
   a first doped silicon layer and a second doped silicon layer formed on the transistor semiconductor layer, the first doped silicon layer and the second doped silicon layer being separated by a channel area;
   a source metal layer and a source transparent conducting layer formed on the first doped silicon layer; and
   a drain metal layer and a drain transparent conducting layer formed on the second doped layer;
   a capacitor comprising:
   a capacitor bottom electrode formed on the substrate;
   a capacitor insulating layer and a capacitor semiconductor layer formed on the capacitor bottom electrode;
   a capacitor doped silicon layer formed on the capacitor semiconductor layer; and
   a capacitor metal layer and a capacitor transparent conducting layer formed on the capacitor doped silicon layer, and the capacitor metal layer being defined as a capacitor upper electrode;
   a gate connecting point comprising a connecting transparent conducting layer formed on the pad electrode;
   a signal line comprising:
   a signal insulating layer formed on the substrate;
   a signal semiconductor layer and a signal doped silicon layer formed on the signal insulating layer;
   a signal metal layer formed on the signal doped silicon layer; and
   a signal transparent conducting layer formed on the signal metal layer; and
   an ESD protective circuit disposed on the substrate, comprising:
   a gate line disposed on and contacting the substrate; and
   a transparent conducting layer contacting the gate line, the signal metal layer of the signal line, and a sidewall of the signal line;
   wherein a side wall of the source metal layer is substantially aligned to a sidewall of the source transparent conducting layer,
   the capacitor transparent conducting layer has a first width, the capacitor metal layer has a second width, the capacitor semiconductor layer has a third width, and the first width, the second width, and the third width are substantially the same, and
   the signal transparent conducting layer has the same pattern with the signal metal layer in the signal line.

2. The thin film transistor liquid crystal display as claimed in claim 1, wherein a side wall of the signal transparent conducting layer sidewall is substantially aligned to a sidewall of the signal metal layer, and the signal transparent conducting layer has the same pattern with the signal metal layer.

3. The thin film transistor liquid crystal display as claimed in claim 1, further comprising a passivation layer covering the thin film transistor, and filling within the channel area of thin film transistor.

4. The thin film transistor liquid crystal display as claimed in claim 1, further comprising a transparent pixel electrode contacting the substrate.

5. A thin film transistor liquid crystal display, comprising:
   a substrate;
   a transparent pixel electrode disposed on and contacting the substrate; and
   an ESD protective circuit disposed on the substrate including:
   a signal line comprising a stacked layer of a signal insulating layer, a signal
   semiconductor layer, a signal doped silicon layer, and a signal metal layer,
   wherein the signal line has a sidewall;
   a gate line disposed on and contacting the substrate; and
   a transparent conducting layer contacting the gate line, the signal metal layer of
   the signal line, and the sidewall of the signal line.

6. The thin film transistor liquid crystal display as claimed in claim 5, further comprising a capacitor disposed on the substrate, wherein the capacitor comprising:
   a capacitor bottom electrode disposed on the substrate;
   a capacitor insulating layer disposed on the capacitor bottom electrode;
   a capacitor semiconductor layer disposed on the capacitor insulating layer;
   a capacitor doped silicon layer disposed on the capacitor semiconductor layer;
   a capacitor metal layer disposed on the capacitor doped silicon layer; and
   a capacitor transparent conducting layer disposed on the capacitor metal layer.

7. The thin film transistor liquid crystal display as claimed in claim 6, wherein the capacitor transparent conducting layer, the capacitor metal layer and the capacitor doped semiconductor layer substantially have the same first width, and the semiconductor layer has second width different from the first width.

8. The thin film transistor liquid crystal display as claimed in claim 7, wherein the first width is narrower then the second width.

9. The thin film transistor liquid crystal display as claimed in claim 7, wherein the capacitor bottom electrode has a third width different from the first width.

10. The thin film transistor liquid crystal display as claimed in claim 9, wherein the first width is greater than the third width.

* * * * *